United States Patent [19]

Sirtl et al.

[11] 4,194,028
[45] Mar. 18, 1980

[54] PROCESS FOR APPLYING A PROTECTIVE LAYER TO SHAPED CARBON BODIES

[75] Inventors: Erhard Sirtl, Marktl; Heinz-Jorg Rath, Burghausen, both of Fed. Rep. of Germany

[73] Assignee: Wacher-Chemitronic Gesellschaft für Elektronik-Grundstoffe mbH, Burghausen, Fed. Rep. of Germany

[21] Appl. No.: 932,963

[22] Filed: Aug. 11, 1978

[30] Foreign Application Priority Data

Aug. 31, 1977 [DE] Fed. Rep. of Germany ....... 2739258

[51] Int. Cl.² .......................... B05D 1/36; B05D 7/22
[52] U.S. Cl. .................................... 427/249; 427/237
[58] Field of Search ............................... 427/249, 237

[56] References Cited

U.S. PATENT DOCUMENTS 2,992,127  7/1961  Jones ................................. 427/190 X

*Primary Examiner*—James R. Hoffman
*Attorney, Agent, or Firm*—Allison C. Collard; Thomas M. Galgano

[57] ABSTRACT

The invention relates to the preparation of a material more favorably priced that the usual quartz crucible for use in the crucible-pulling of silicon according to Czochralski. To prevent reaction of the crucible wall with molten silicon, the surface of the shaped carbon body is coated by means of chemical vapor deposition first with a carbon-enriched silicon carbide layer and then with a carbon-enriched silicon nitride layer. The carbon-enriched silicon carbide layer is obtained by reacting a gaseous silicon compound with a gaseous carbon compound at a temperature of the shaped carbon body to be coated at 1250° to 1350° C. while the carbon-enriched silicon nitride layer is obtained by reacting a gaseous organosilicon compound with ammonia at a temperature of the shaped carbon body of 1000° to 1200° C.

15 Claims, 1 Drawing Figure

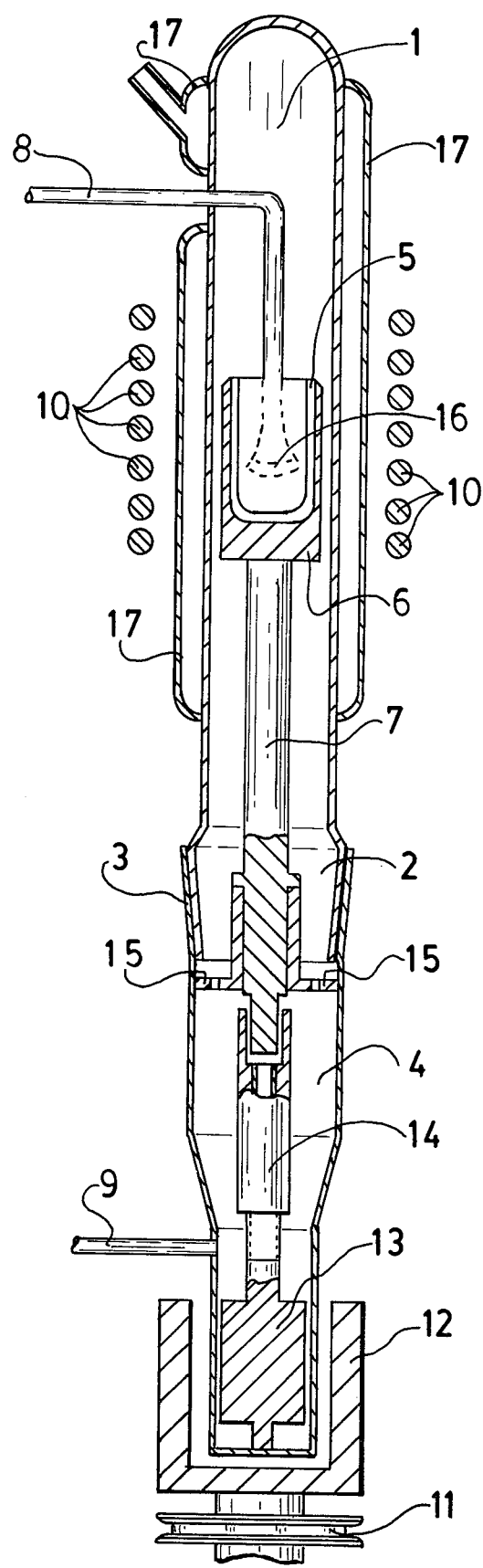

PROCESS FOR APPLYING A PROTECTIVE LAYER TO SHAPED CARBON BODIES

Shaped carbon bodies and especially shaped graphite bodies are used widely in engineering for high temperature processes because of their excellent thermal endurance over long time periods. Graphite crucibles have also proved suitable for accommodating the germanium melt in the crucible pulling of germanium according to Czochralski process. It is not possible, however, to use such graphite crucibles for the crucible pulling of silicon since, at the high temperatures used, the melt attacks the graphite crucible and forms silicon carbide. For this reason, other crucible materials have had to be found for the crucible pulling of silicon. Of the melt crucibles made of copper, silver, tantalum, tungsten, molybdenum, magnesium oxide, aluminum oxide or quartz proposed in numerous patent applications especially during the 1950s, only the latter have been successful. According to the current process, the silicon melt is accommodated by a quartz crucible which is surrounded on the outside by a second crucible made of graphite. For the large rod diameters and lengths that now can be pulled according to the Czochralski process, enormous quartz crucibles are necessary to accommodate the required quantities of melt. The production costs of such quartz crucibles, which usually can only be used once, are extremely high, so that the crucible material becomes a considerable proportion of the manufacturing costs of the crucible pulled silicon rods.

U.S. Pat. No. 2,992,127 describes a process for making graphite crucibles which are resistant to oxidation processes, and especially to the attack of molten silicon. In accordance with this process, the surface of the graphite body to be coated is covered with powdered silicon, heated to a temperature above 1360° C. in an inert gas atmosphere, and reacts to form on the surface a cohesive layer of silicon carbide. Optionally, in a second step, in addition, silicon nitride can be applied in pulverized form and sintered together with the shaped body at elevated temperature. The disadvantage of this process is that curved shaped carbon bodies cannot be coated with a layer of silicon carbide or silicon nitride of uniform thickness. Also, the surface layer produced in these sintering processes has a very poor pore density. With time, molten silicon penetrates into these pores and attacks the underlying graphite body, destroying it. Furthermore, carbon can escape from the graphite body via corresponding pores in the covering layer and penetrate as an undesired foreign substance into the silicon melt and thus also, to some extent, into the silicon rod pulled from this melt.

The problem underlying the invention was therefore to find a protective layer for shaped carbon bodies that makes the surface of such shaped bodies completely resistant to the attack of molten silicon, thus enabling repeated use.

This problem is solved by depositing from a carrier gas by chemical vapor deposition onto the surface to be coated of the shaped carbon body heated to a temperature of 1250° to 1350° C. the reaction product of a gaseous admixture containing silicon and carbon, and subsequently applying to this first layer, by chemical vapor deposition from a carrier gas, the reaction product of a gaseous organosilicon compound and ammonia, with the shaped carbon body at a temperature of 1000° to 1200° C.

The invention is explained in detail in the following:

The shaped carbon body to be coated is placed in a suitable reactor, preferably provided with a mounting for the body to be coated, which makes it possible to rotate the shaped carbon body in the flow of the deposition gases in order to achieve a coating that is as uniform as possible. Before the actual deposition, the shaped carbon body to be coated is heated to a temperature of 1250° to 1350° C. by means of a suitable heating device, for example a resistance heater or, preferably, an induction coil. In order to avoid oxidation of the shaped carbon body at these high temperatures, it is necessary to rinse the reactor free of air beforehand with an appropriate inert gas, for example, argon. While the shaped carbon body is being heated, a carrier gas is introduced into the reactor through a suitable gas inlet in a quantity of 0.1 to 6 liters per hour per $cm^2$ of the surface to be coated (measured at standard temperature and pressure). Suitable carrier gases are especially argon and hydrogen. When the shaped carbon body is heated to the temperature of 1250° to 1350° C. necessary for the deposition in the first stage, the gases necessary for the deposition in the first stage are admixed with the carrier gas or, alternatively, introduced separately into the deposition reactor. The silicon containing gaseous admixture is used in admixture with excess hydrogen, advantageously in admixture with 85 to 95% by volume, preferably approximately 92 to 94% by volume, of hydrogen, and introduced into the reactor in quantities of 0.01 to 0.2 liters per hour per $cm^2$ of surface to be coated (measured at standard temperature and pressure).

Suitable silicon containing gaseous admixtures are, especially, chlorosilanes, such as, for example, monochlorosilane, dichlorosilane, trichlorosilane, silicon tetrachloride and especially trichlorosilane being preferred.

In addition to the silicon containing gaseous admixture, the carbon containing gaseous admixture of the first stage in admixture with excess hydrogen, advantageously 85 to 95% by volume, preferably 88 to 92% by volume, of hydrogen, is introduced into the reactor, either in the carrier gas or directly, to the atmosphere of the reactor, in quantities of 0.01 to 4 liters per hour per $cm^2$ of the surface to be coated (measures at standard temperature and pressure). Although it is possible to use the silicon containing and carbon containing gaseous admixtures in stoichiometric amounts with respect to a silicon carbide deposition, generally an excess of the carbon component over the silicon component is preferred so as to deposit a carbon enriched silicon carbide layer on the shaped carbon body. The gas ratio is advantageously selected so that, calculated on the elements, the carbon is present in the deposition gas in an excess of 5 to 20 times compared with the silicon.

Carbon containing gaseous admixtures that come into consideration are generally hydrocarbons, especially chlorinated hydrocarbons, the best results having been obtained with chlorinated hydrocarbons having 1 to 2 carbon atoms, such as, for example, methyl chloride or ethyl chloride.

Although the production in the first stage of a silicon carbide layer, enriched with carbon to a greater or lesser extent, by decomposition of a silicon containing gaseous compound and by decomposition of a carbon containing gaseous compound is preferred, since in this process variant, the ratio of silicon to carbon can be varied as desired during the deposition, it is nevertheless equally possible to introduce silicon and carbon into the reactor in the form of a single gaseous compound, for example, an organo silicon compound.

The deposition as such as carried out in the first and in the second stage, usually at a pressure of approximately 0.5 to 2 bar, deposition at normal pressure naturally being the most rational choice.

The deposition in the first stage, which, according to the preferred embodiment, produces a carbon containing silicon carbide layer, is advantageously interrupted after a layer thickness of approximately 5 to 100 $\mu$m has been reached, and the shaped carbon body being coated is cooled to a temperature of approximately 1000° to 1200° C., preferably 1050 to 1150° C. After rinsing the reactor free of deposition gases from the first stage with hydrogen or argon, and after the shaped carbon body has reached a constant temperature, the carrier gas, which also in the second stage is introduced in a quantity of 0.1 to 6 liters per hour per $cm^2$ of surface to be coated (measured at standard temperature and pressure,) and which in the second stage apart from hydrogen and argon may also be, for example, nitrogen, and a gaseous organosilicon compound in admixture with excess hydrogen, advantageously, 80% to 95% by volume, preferably, 82% to 88% by volume of hydrogen, in a quantity of 0.01 to 0.2 liters per hour per $cm^2$ of surface to be coated (measured at standard temperature and pressure) are introduced into the reactor.

Apart from the gaseous organosilicon compound, ammonia gas is simultaneously introduced into the reactor in quantities of approximately 0.1 to 6 liters per hour per $cm^2$ of deposition area (measured at standard temperature and pressure,) the silicon/nitrogen ratio in the gas atmosphere of the reactor advantageously being adjusted from 1:10 to 1:30.

The gaseous organosilicon compounds that come into consideration are, for example, methylated or ethylated chlorosilanes or silanes. Preferably, tetramethylsilane is used as the organosilicon compound, because it has the advantage that it does not enter into reaction with the ammonia until it is in the immediate vicinity, that is, shortly before reaching the surface of the shaped carbon body to be coated. For this reason, it is necessary when using other organosilicon compounds, to introduce these into the reactor separately from the ammonia gas, so as to prevent reaction of the two gases in the supply lines.

To obtain layers of the greatest possible uniformity, it is necessary, in the first and in the second stages, to maintain the temperature of the shaped carbon body to be coated, at as constant a level as possible. The deposition in the second stage is advantageously interrupted when a layer thickness of nitrogen-enriched silicon nitride of approximately 10 to 1500 $\mu$m has been reached and the reactor is rinsed free of the deposition gases by means of an inert gas, such as, especially, argon.

Advantageously, to solidify the layers, the carbon body is tempered in the same reactor at approximately 1300° to 1400° C. for some time, for example, a few hours. Protective layers of this type produced on the shaped carbon body are absolutely pore-free and therefore, gas-tight. The coated carbon body has a high chemical resistance and can be brought into contact for prolonged periods with molten silicon without any risk. Shaped carbon bodies coated in this manner are suitable for repeated use, but it is generally propitious to renew the coating from time to time, irrespective of the use of the particular shaped carbon body. The shaped carbon or graphite bodies coated in accordance with the process of the invention, especially crucibles, are considerably cheaper than the expensive quartz or glassy carbon crucibles and, at the same time, have greater endurance.

The invention is explained by way of example, with reference to the drawing, which shows schematically, a simple device for carrying out the process of the invention.

Referring to the drawing, there is shown an upright quartz reactor, consisting of an upper part 1, which is fitted in a gas-tight manner by means of a ground core 2 into a sleeve 3 of a lower part 4, likewise made of quartz, of the quartz apparatus. A graphite crucible 5 is placed in a quartz susceptor 6 of matching shape, which can be rotated about its vertical axis by means of a crucible shaft 7. The internal diameter of the quartz reactor in the upper cylindrical part is 50 mm, the height of the total quartz apparatus being 500 mm.

Before the actual deposition, the inside of the reactor was rinsed free with argon introduced through the gas inlet 8, the gases being displaced from the system through the gas outlet 9. After a rinsing time of approximately 30 minutes, apart from argon, hydrogen was introduced in addition, and the graphite crucible 5 was heated to approximately 1300° C. by means of an induction coil 10. When the graphite crucible has reached the specified temperature, the argon flow was switched off and hydrogen, as carrier gas, was introduced into the reactor through gas inlet 8 in a quantity of 1.5 liters per hour per $cm^2$ of the crucible surface to be coated (measured at standard temperature and pressure). In addition to being admixed with the carrier gas, the reaction gases were admixed with 0.1 liters per hour per $cm^2$ of crucible surface to be coated (measured at standard temperature and pressure) of an additional gas mixture of trichlorosilane by 93% volume of hydrogen, and 1 liter per hour per $cm^2$ of crucible surface to be coated (measured at standard temperature and pressure) of a gas mixture of 1,1 dichloroethylene in 89% by volume of hydrogen. By regulating the gas supply and discharge, a pressure of 1.2 bar was established in the reactor. During deposition, crucible 5 was rotated about its vertical axis at a speed of 30 rev/min. This rotation was transmitted by a V-belt drive 11 to the outer magnets 12 and, via these, to the smaller magnets 13 located inside the apparatus and to the crucible shaft 7 connected via the intermediate member 14. The exact centering of the quartz shaft 7 was guaranteed by a ground-in-quartz ring 15. The uniform deposition of the carbon-enriched silicon carbide layer on the inside of the carbon crucible was further additionally assisted by a perforation in the lower part of gas inlet 8 opening into the inside of the crucible and by the sealing quartz frit 16. To prevent deposition on the walls of the quartz reactor itself, the upper part of the quartz reactor was provided with a cooling jacket 17, through which water passed. After a deposition time in the first stage of 4 hours, the thickness of the carbon-enriched silicon carbide layer on the inner wall of the graphite crucible was approximately 50 $\mu$m.

After being coated with silicon carbide, the temperature of graphite crucible 5 was lowered to 1050° C., the flow of reaction gases was turned off, and the reactor was rinsed with hydrogen to remove all chlorine-containing reaction gases from the system. After a rinsing time of approximately 15 minutes, to produce an additional carbon-containing silicon nitride layer, the hydrogen stream functioning as carrier gas was left at 1.5 liters per hour per cm² of crucible surface to be coated (measured at standard temperature and pressure,) but, in addition, a gas mixture of 0.1 liters per hour per cm² of crucible surface to be coated (measured at standard temperature and pressure) of tetramethylsilane in 85% by volume of hydrogen, and 1.2 liters per hour per cm² of crucible surface to be coated (measured at standard temperature and pressure) of ammonia were passed through the reactor at a pressure of 1.2 bar. The duration of deposition in the second stage was approximately 5 hours, and the layer thickness, calculated on carbon-containing silicon nitride, was approximately 200 μm.

After cooling the coated graphite crucible to room temperature and rinsing the apparatus with argon, the crucible was removed and silicon was melted in it in a second apparatus. After 10 hours, the silicon melt was poured out and the surface of the graphite crucible was examined. It showed no signs of corrosion that would have made re-use impossible.

It will be obvious to those skilled in the art that other changes and variations can be made in carrying out the present invention without departing from the spirit and scope thereof, as defined in the appended claims.

What is claimed is:

1. A process for applying a protective layer to shaped carbon bodies within a reactor, comprising the steps of:
   heating the shaped carbon bodies to a temperature of 1250° to 1350° C.;
   depositing by vapor deposition the reaction products of a gaseous admixture containing a carrier gas and a member selected from the group consisting of (a) a silicon- and carbon-containing gaseous compound and (b) a gaseous admixture including a silicon-containing gaseous compound and a carbon-containing gaseous compound onto the surface of the shaped carbon bodies so as to produce a silicon carbide layer;
   lowering the temperature of the carbon bodies to between 1000° and 1200° C.; and
   subsequently depositing by chemical vapor deposition from a carrier gas onto the shaped carbon body, the reaction product of a gaseous organosilicon compound and ammonia so as to produce a silicon nitride layer.

2. The process according to claim 1, wherein each deposition step includes introducing the carrier gas into the reactor in a quantity of 0.1 to 6 liters per hour per cm² of the surface to be coated, measured at standard temperature and pressure.

3. The process according to claim 1, wherein the silicon-containing gaseous compound is introduced into the reactor in admixture with excess hydrogen in quantities of 0.01 to 0.2 liters per hour per cm² of the surface to be coated, measured at standard temperature and pressure.

4. The process according to claim 1, wherein the silicon-containing gaseous compound of the first depositing step is introduced into the reactor in admixture with 85 to 95% by volume of hydrogen.

5. The process according to claim 1, wherein chlorosilanes are used as the silicon-containing gaseous compound of the first depositing step.

6. The process according to claim 1, wherein trichlorosilane is used as the silicon-containing gaseous compound in the first depositing step.

7. The process according to claim 1, wherein the carbon-containing gaseous compound is introduced into the reactor in admixture with excess hydrogen in quantities of 0.01 to 4 liters per hour per cm² of the surface to be coated, measured at standard temperature and pressure.

8. The process according to claim 1, wherein the carbon-containing gaseous compound of the first depositing step is introduced into the reactor in admixture with 85 to 95% by volume of hydrogen.

9. The process according to claim 1, wherein chlorinated hydrocarbons containing 1 to 2 carbon atoms are used as the carbon-containing gaseous compound.

10. The process according to claim 1, wherein the first depositing step is effected to a layer thickness of 5 to 100 μm.

11. The process according to claim 1, wherein the gaseous organosilicon compound of the second depositing step is introduced into the reactor with excess hydrogen in quantities of 0.01 to 0.2 liters per hour per cm² of the surface to be coated, measure at standard temperature and pressure.

12. The process according to claim 1, wherein the gaseous organosilicon compound is introduced into the reactor in admixture with 80 to 95% by volume of hydrogen.

13. The process according to claim 1, wherein tetramethylsilane is used as the gaseous organosilicon compound.

14. The process according to claim 1, wherein ammonia is introduced into the reactor in quantities of 0.1 to 6 liters per hour per cm² of deposition area, measured at standard temperature and pressure.

15. The process according to claim 1, wherein the second deposition step is effected to a layer thickness of 10 to 1500 μm.

* * * * *

UNITED STATES PATENT AND TRADEMARK OFFICE
CERTIFICATE OF CORRECTION

PATENT NO. : 4,194,028
DATED : March 18, 1980
INVENTOR(S) : ERHARD SIRTL et al

It is certified that error appears in the above—identified patent and that said Letters Patent is hereby corrected as shown below:

Heading (73) Assignee, change "Wacher" to --Wacker--.
Abstract, line 2, change "that" to --than--. Column 2, line 45, change "measures" to --measured--. Column 3, line 4, change "as"(second occurence) to --is--. Column 4, line 27, change "has" to --had--. Claim 11, line 5, change "measure" to --measured--.

Signed and Sealed this

Twenty-ninth Day of July 1980

[SEAL]

Attest:

SIDNEY A. DIAMOND

Attesting Officer     Commissioner of Patents and Trademarks